(12) United States Patent
Kawakubo et al.

(10) Patent No.: US 7,211,933 B2
(45) Date of Patent: May 1, 2007

(54) VOLTAGE CONTROLLED OSCILLATOR

(75) Inventors: Takashi Kawakubo, Yokohama (JP);
Kazuhide Abe, Kawasaki (JP);
Mayumi Morizuka, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 222 days.

(21) Appl. No.: 10/935,264

(22) Filed: Sep. 8, 2004

(65) Prior Publication Data

US 2005/0099236 A1 May 12, 2005

(30) Foreign Application Priority Data

Sep. 19, 2003 (JP) .............................. 2003-327688

(51) Int. Cl.
*H01L 41/08* (2006.01)
(52) U.S. Cl. ...................... 310/334; 310/320; 310/366
(58) Field of Classification Search ................ 310/324, 310/334
See application file for complete search history.

(56) References Cited

U.S. PATENT DOCUMENTS

| | | | |
|---|---|---|---|
| 5,166,646 A * | 11/1992 | Avanic et al. .......... | 331/107 A |
| 5,714,917 A * | 2/1998 | Ella ........................ | 332/144 |
| 6,924,583 B2 * | 8/2005 | Lin et al. ................ | 310/324 |
| 7,053,456 B2 * | 5/2006 | Matsuo .................. | 257/415 |
| 7,053,730 B2 * | 5/2006 | Park et al. ............. | 333/133 |

FOREIGN PATENT DOCUMENTS

| | | |
|---|---|---|
| JP | 63-501993 | 8/1988 |
| JP | 2000-101345 | 4/2000 |
| WO | 01/078230 | 10/2001 |

OTHER PUBLICATIONS

A. P. S. Khanna et al., "A 2GHz Voltage Tunable FBAR Oscillator", IEEE MTT-S Digest, Jul. 2003, pp. 717-720.

* cited by examiner

*Primary Examiner*—Mark Budd
(74) *Attorney, Agent, or Firm*—Oblon, Spivak, McClelland, Maier & Neustadt, P.C.

(57) ABSTRACT

The present invention provides a voltage controlled oscillator comprising an thin film BAW resonator and a variable capacitor element. The thin film BAW resonator includes an anchor section formed on a Si substrate, a lower electrode supported on the anchor section and positioned to face the Si substrate, a first piezoelectric film formed on the lower electrode, and an upper electrode formed on the first piezoelectric film. On the other hand, the variable capacitor element includes a stationary electrode formed on a Si substrate, an anchor section formed on the Si substrate, a first electrode supported on the anchor section and positioned to face the Si substrate, a second piezoelectric film formed on the first electrode, and a second electrode formed on the second piezoelectric film.

14 Claims, 6 Drawing Sheets

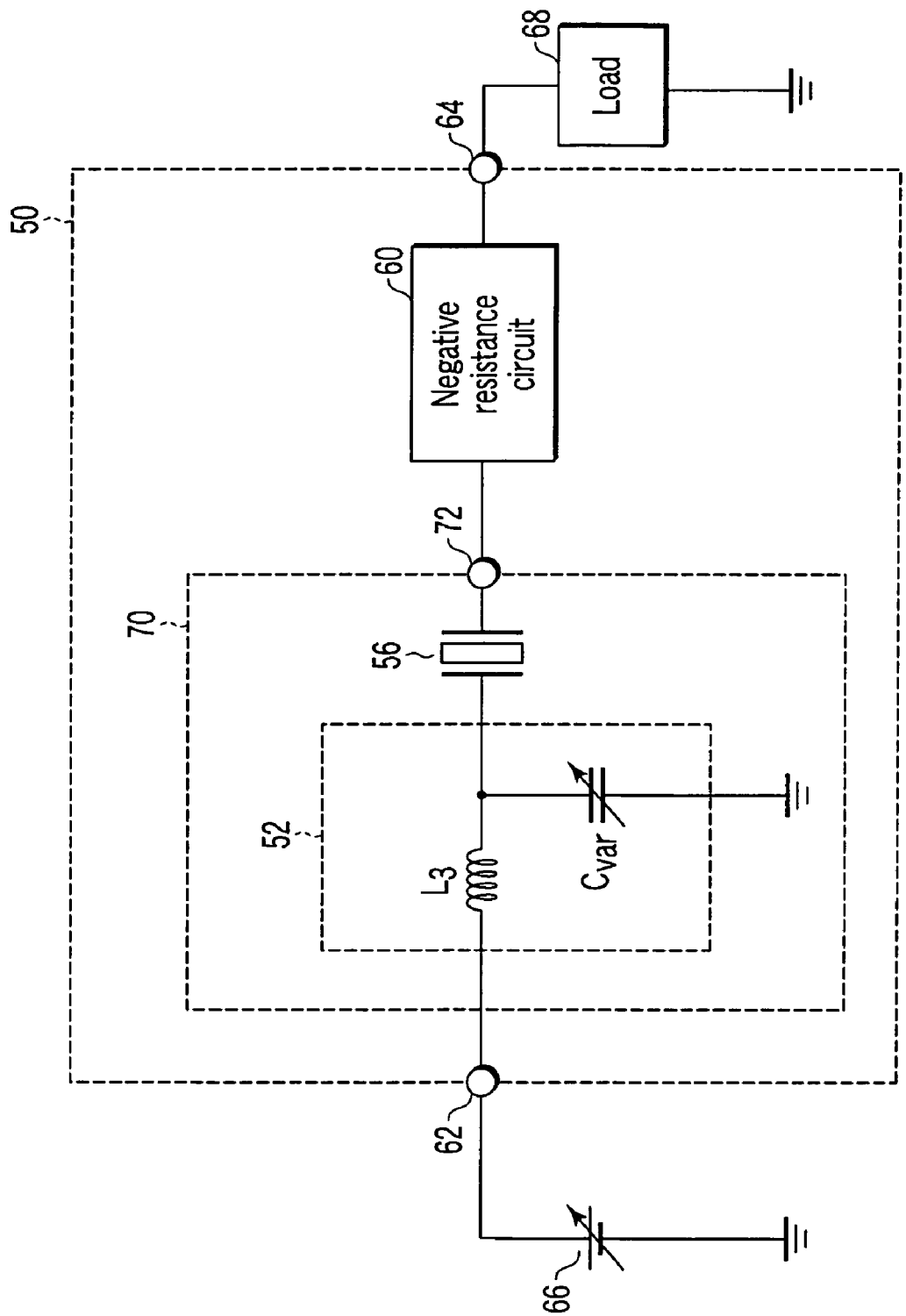
F I G. 1

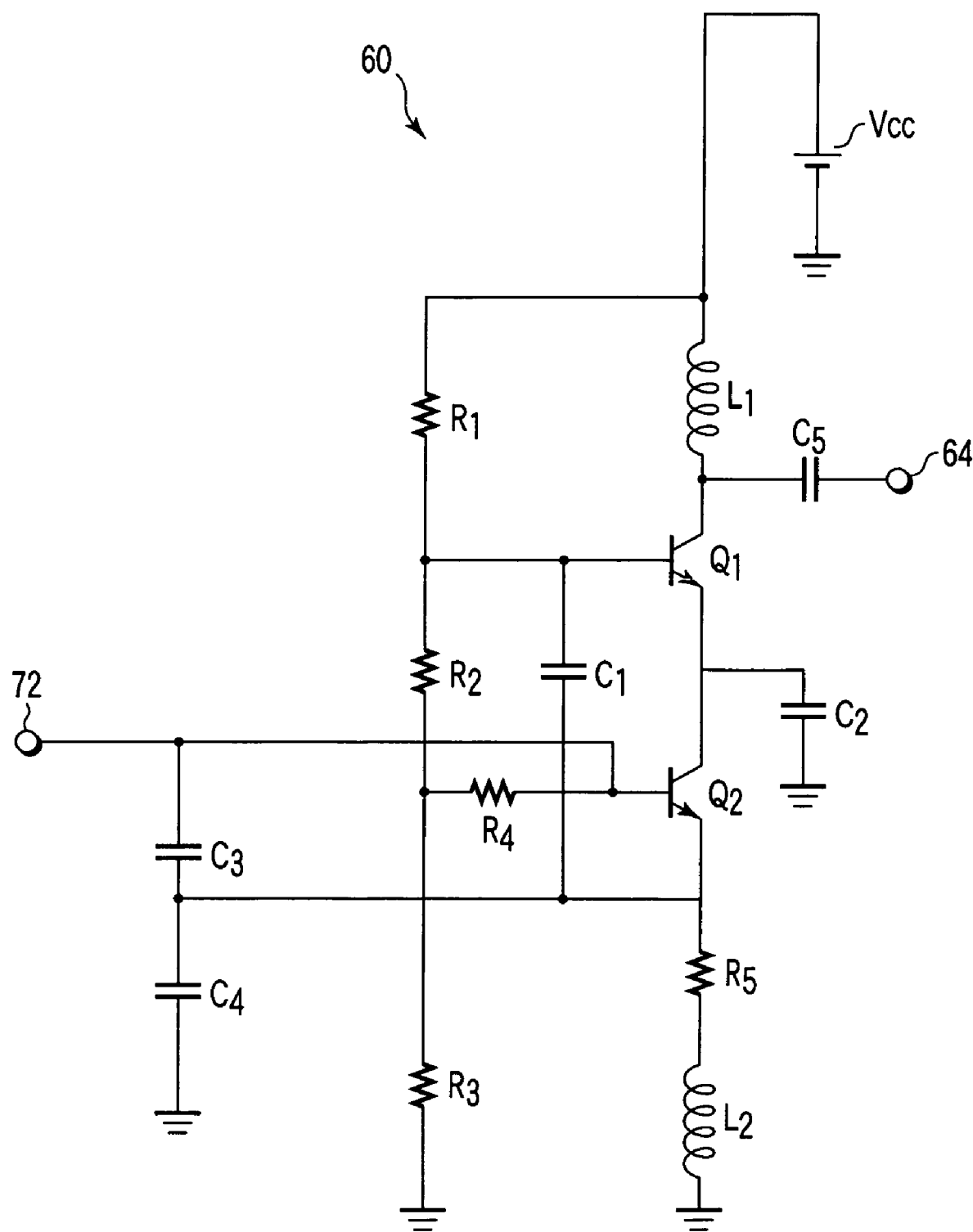
F I G. 2

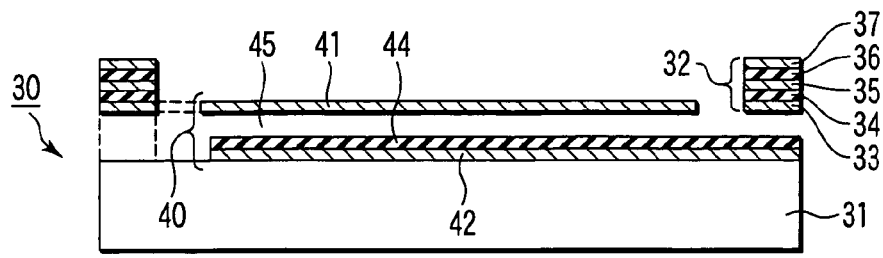
F I G. 5
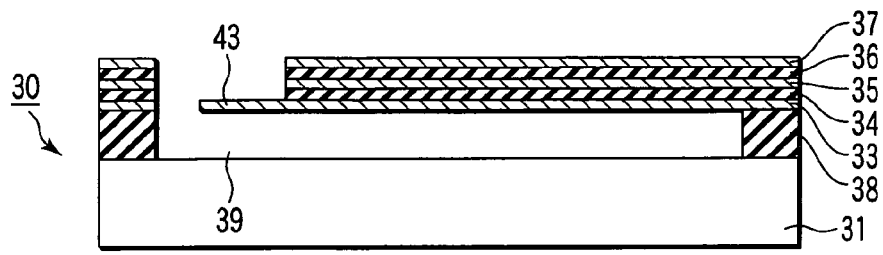
F I G. 6
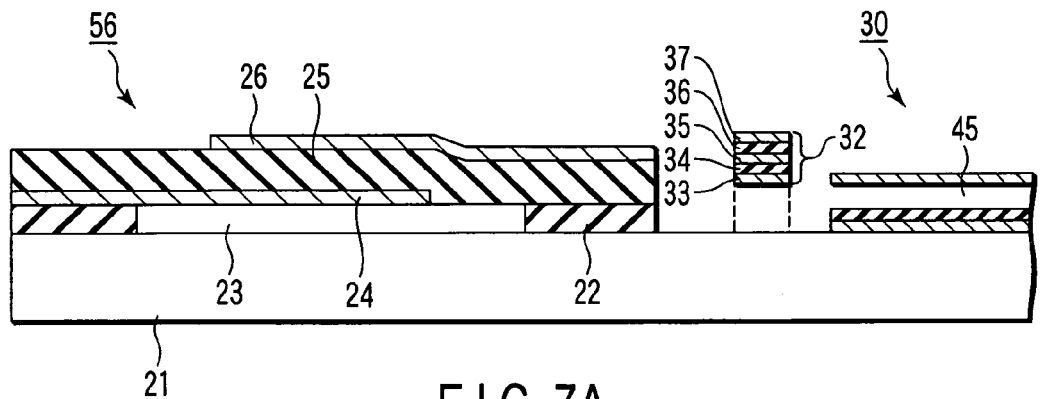
F I G. 7A
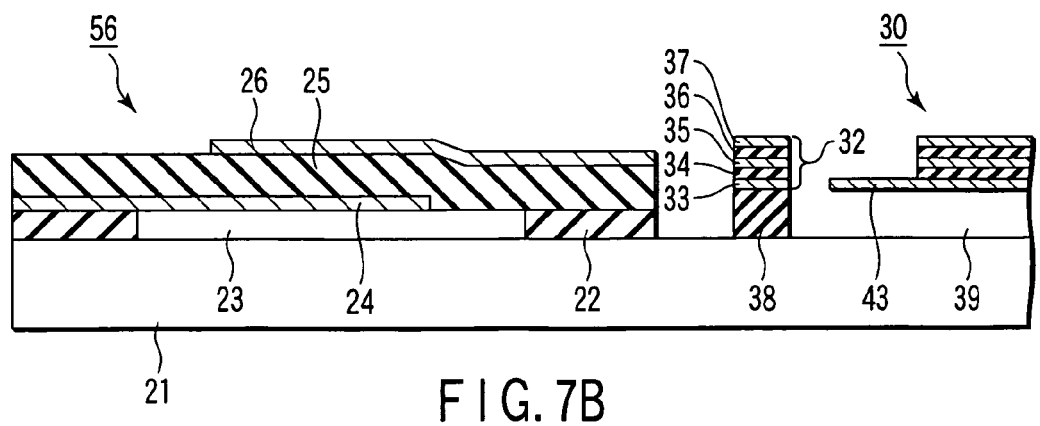
F I G. 7B

VOLTAGE CONTROLLED OSCILLATOR

CROSS-REFERENCE TO RELATED APPLICATIONS

This application is based upon and claims the benefit of priority from prior Japanese Patent Application No. 2003-327688, filed Sep. 19, 2003, the entire contents of which are incorporated herein by reference.

BACKGROUND OF THE INVENTION

1. Field of the Invention

The present invention relates to a voltage controlled oscillator, particularly, to a voltage controlled oscillator equipped with a thin film BAW resonator that is utilized in a mobile wireless communication technology such as a portable telephone.

2. Description of the Related Art

The conventional voltage controlled oscillator comprises a tank circuit including an inductor formed of a coil or a strip line and a variable capacitor element using a varactor diode having the capacitance value changed by the voltage. The conventional voltage controlled oscillator is advantageous in that the frequency can be varied over a wide range that is not smaller than 10%, but is defective in that the inductor included in the voltage controlled oscillator is large, and that the phase noise is large because the Q value (mechanically quality coefficient) of the inductor or the varactor is small.

Recently, a voltage controlled oscillator utilizing a thin film BAW (Bulk Acoustic Wave) resonator, i.e., Film Bulk Acoustic Wave Resonator (FBAR), attracts attentions. The thin film BAW resonator has an element structure prepared by successively forming a lower electrode, a piezoelectric film, and an upper electrode one upon the other on a substrate with a gap interposed between the lower electrode and the substrate.

A voltage controlled oscillator comprising a tank circuit formed of the thin film BAW resonator and the varactor diode is disclosed in, for example, "A 2 GHz voltage tunable FBAR oscillator" by A. P. S. Khanna, E. Gane and T. Chong, which is reported in "2003 IEEE MTT-S Digest, pp. 717-20, 2003". The voltage controlled oscillator disclosed in this literature has a frequency variable width that is determined by the electromechanical coupling constant ($k^2$) of the thin film BAW resonator and the capacitance change ratio of the varactor diode. When it comes to a combination of, for example, a thin film BAW resonator using a piezoelectric film formed of AlN and a varactor diode, the constant $k^2$ is about 6% and the capacitance change ratio, i.e., the ratio of the maximum capacitance to the minimum capacitance, is at most about 4. As a result, the range within which the frequency can be changed is small, i.e., about 2 to 3%. It follows that the particular combination noted above gives rise to the problem that the variable range of the frequency is excessively small when the combination is used in the voltage controlled oscillator used in many mobile wireless systems.

It should also be noted that that the Q value of the varactor diode is markedly smaller than the Q value of the thin film BAW resonator, with the result that the Q value of the oscillator is lowered so as to give rise to the problem that the phase noise is increased.

As described above, the voltage controlled oscillator using a thin film BAW resonator and a varactor diode is defective in that the frequency variable range is small and that the phase noise is large.

BRIEF SUMMARY OF THE INVENTION

According to an aspect of the present invention, there is provided a voltage controlled oscillator, comprising a thin film BAW resonator and a variable capacitance element, the thin film BAW resonator including:

a first substrate section;

a first support section formed on the first substrate section;

a lower electrode supported on the first support section and arranged to face the first substrate section;

a first piezoelectric film formed on the lower electrode; and an upper electrode formed on the first piezoelectric film; and the variable capacitor element including:

a second substrate section;

a stationary electrode formed on the second substrate section;

a second support section formed on the second substrate section;

an actuator including a first electrode supported on the second support section, a second piezoelectric film formed on the first electrode, and a second electrode formed on the second piezoelectric film; and a movable electrode arranged to face the stationary electrode, mechanically coupled to and supported on the actuator and electrically connected to one of the lower electrode and the upper electrode.

According to another aspect of the present invention, there is provided a method of manufacturing a voltage controlled oscillator in which a thin film BAW resonator and a variable capacitance element are formed on a first substrate, comprising forming the thin film BAW resonator, which includes:

forming an insulating film on the first substrate;

forming a lower electrode layer, which is positioned to face the first substrate, on the insulating film;

forming a first piezoelectric film on the lower electrode layer;

forming an upper electrode layer on the first piezoelectric film; and selectively patterning the lower electrode layer, the first piezoelectric film and the upper electrode layer such that the insulating film is patterned in a manner to form the support section, thereby forming a laminate structure of the lower electrode, the first piezoelectric film, and the upper electrode, which is supported on the first support section with a gap formed between the first substrate and the laminate structure; and forming the variable capacitor element, which includes:

forming a stationary electrode on the first substrate;

covering the stationary electrode with a dielectric film;

forming an insulating film on the first substrate section;

forming a first electrode on the insulating film;

forming a second piezoelectric film on the first electrode;

forming a second electrode on the second piezoelectric film;

selectively patterning the first electrode, the second piezoelectric film and the second electrode so as to form an actuator of a laminate structure consisting of the first electrode, the second piezoelectric film, and the second electrode and to form a movable electrode positioned to face the stationary electrode and mechanically coupled to and supported on the actuator; and selectively patterning the insulating film so as to form a gap between the movable electrode and the stationary electrode and to form a first support section for supporting the actuator.

BRIEF DESCRIPTION OF THE SEVERAL VIEWS OF THE DRAWING

FIG. 1 is a block diagram schematically showing the construction of a voltage controlled oscillator according to a first embodiment of the present invention;

FIG. 2 is a circuit diagram showing the circuit construction of a negative resistance circuit included in the block diagram shown in FIG. 1;

FIG. 5 is a cross sectional view along the line V—V shown in FIG. 4, the cross sectional view schematically exemplifying the arrangement of the variable capacitance element formed of the thin film piezoelectric actuator included in the block diagram shown in FIG. 1;

FIG. 6 is a cross sectional view along the line VI—VI shown in FIG. 4, the cross sectional view schematically exemplifying the arrangement of the variable capacitance element formed of the thin film piezoelectric actuator included in the block diagram shown in FIG. 1;

FIGS. 7A and 7B are cross sectional views collectively showing schematically the construction of a tank circuit included in the block diagram shown in FIG. 1, the tank circuit including a thin film BAW resonator and a variable capacitance element formed on the same substrate;

DETAILED DESCRIPTION OF THE INVENTION

Figure 3:
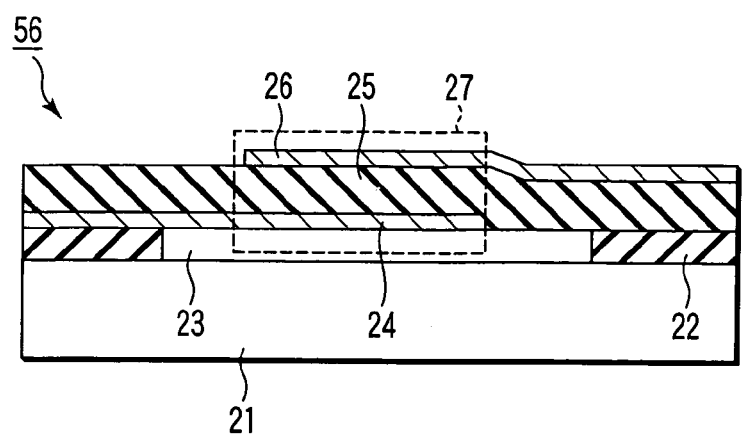
FIG. 3 is a cross sectional view schematically exemplifying the construction of a thin film BAW resonator included in the block diagram shown in FIG. 1.

The voltage controlled oscillators according to some embodiments of the present invention will now be described with reference to the accompanying drawings.

First Embodiment

FIG. 1 is a circuit block diagram schematically showing the construction of a voltage controlled oscillator 50 according to a first embodiment of the present invention.

As shown in FIG. 1, the voltage controlled oscillator (VCO) 50 comprises a resonance circuit 70 and a negative resistance circuit 60 connected to the resonance circuit 70 via a connection terminal 72.

The resonance circuit 70 comprises a reactance control section 52 and a thin film BAW resonator 56, i.e., FBAR (Film Bulk Acoustic Wave Resonator), which is connected in series to the reactance control section 52. The reactance control section 52 is connected to an input terminal 62 and comprises an inductor $L_3$ and a capacitor $C_{Var}$. In other words, the resonance circuit 70 forms a so-called "tank circuit" including the reactance control section 52 and the thin film BAW resonator 56. A control voltage source 66, which is connected at one end to the ground, is connected at the other end to the input terminal 62. Also, one end of the negative resistance circuit 60 is connected to the resonance circuit 70 via a connection terminal 72, and an output terminal 64 is connected to the other end of the negative resistance circuit 60. Further, a load 68 is connected to the output terminal 64. As described herein later, it is possible to form the reactance control section 52 and the thin film BAW resonator 56 on the same substrate so as to make it possible to miniaturize the circuit itself.

If a certain input voltage is applied from the control voltage source 66 to the input terminal 62, an output voltage that is determined by the inductor $L_3$ and the capacitor $C_{Var}$ is generated at the connecting point between the inductor $L_3$ and the capacitor $C_{Var}$. The output voltage thus generated is applied from the reactance control section 52 to the thin film BAW resonator 56 within the resonance circuit 70. Upon application of the output voltage to the thin film BAW resonator 56, the thin film BAW resonator 56 is operated, with the result that a resonance output signal dependent on the mechanical resonance point of the thin film BAW resonator 56 is generated from the thin film BAW resonator 56.

As shown in FIG. 2, the negative resistance circuit 60 comprises a DC power source Vcc connected to the ground on the negative side and bipolar transistors Q1, Q2. A series circuit consisting of an inductor L1 and a resistor R1 is connected between the collector and the base of the transistor Q1, and the DC power source Vcc is connected to the collector and the base of the transistor Q1 through the inductor L1 and the resistor R1, respectively. The collector of the transistor Q2 is connected to the emitter of the transistor Q1, and a resistor R2 is connected to the base of the transistor Q1. Further, a capacitor C5 is connected between the collector of the transistor Q1 and the output terminal 64.

The base of the transistor Q2 is connected to the connection terminal 72 of the resonance circuit 70 and to the DC power source Vcc via a series circuit consisting of the resistors R1, R2 and R4. Also, the base of the transistor Q2 is connected to the ground via the resistors R3 and R4. A resistor R5 is connected between the emitter of the transistor Q2 and an inductor L2, and a capacitor C1 is connected between the base of the transistor Q1 and the emitter of the transistor Q2. A capacitor C2, which is connected to the ground, is connected to the connecting point between the emitter of the transistor Q1 and the collector of the transistor Q2, and a capacitor C3 is connected between the base and the emitter of the transistor Q2. Further, the emitter of the transistor Q2 is connected to a capacitor C4 that is connected to the ground.

In the circuit arrangement shown in FIG. 2, the bipolar transistors Q1 and Q2 are arranged to form a cascade circuit in which the emitter of the transistor Q1 is connected to the collector of the transistor Q2. In this construction, the transistor Q1 acts as a buffer transistor for the driving of a load, and the transistor Q2 plays the role of an oscillating transistor. The DC power source Vcc is a power source for supplying voltage to each of the transistors Q1 and Q2, the resistors R1, R2, R3, R4 and R5 act as bias resistors for determining the operating point of each of the transistors Q1 and Q2.

The inductor L1 connected between the DC power source Vcc and the collector of the transistor Q1 and the inductor L2 connected between the emitter of the transistor Q2 and the ground with the resistor R5 interposed therebetween are intended to permit the DC component alone to be transmitted therethrough and to prevent the higher frequency components from being released to the power source Vcc and the ground GND.

The capacitor C1 is a capacitor for transmitting the high frequency power oscillated from the transistor Q2 to the transistor Q1. The capacitor C2 is a capacitor for connecting the collector of the transistor Q2 to the ground in a high frequency mode. Each of the capacitors C3 and C4 is a capacitor for feeding again the signal appearing on the emitter of the transistor Q2 as a result of the amplification of the high frequency signal supplied to the base of the transistor Q2 back to the base of the transistor Q2 through the resonance circuit 70. Further, the capacitor C5 is a capacitor for allowing a high frequency signal to be outputted from the collector of the transistor Q1 to the output terminal 64.

In the circuit shown in FIG. 2, the voltage of the DC power source Vcc, which is divided by the corresponding resistors R1, R2, R3, R4, is applied to the base of each of the transistors Q1 and Q2. If a resonance output is supplied under this state from the resonance circuit 70 to the base of the transistor Q2 through the connection terminal 72, the emitter output of the transistor Q2 is fed back through the capacitor C3 so as to allow the transistor Q2 to start its oscillation. The oscillating output of the transistor Q2 is supplied to the base of the transistor Q1 through the capacitor C1, with the result that the transistor Q1 is also caused to start its oscillating operation by the emitter output of the transistor Q2 via the capacitor C1. It follows that the oscillating output is amplified in accordance with the oscillation of the transistors Q1 and Q2, which is determined mainly by the time constant of the capacitor C1, and the amplified oscillating output is outputted from the output terminal 64 to the load 68 via the capacitor C5.

Incidentally, in the circuit construction shown in FIG. 2, the bipolar transistors Q1, Q2 are used in the negative resistance circuit 60. It is certainly possible to use, for example, field effect transistors (FETs) in the negative resistance circuit 60 in place of the bipolar transistors. However, it is desirable to use the bipolar transistors, which are relatively low in the flicker noise, in view of the effect of suppressing the noise generation. Also, it is possible to use in the negative resistance circuit 60 a negative resistance circuit having an inverter formed of a complementary metal .oxide. semiconductor (CMOS) transistor incorporated therein.

FIG. 3 is a cross sectional view schematically exemplifying the construction of the thin film BAW resonator 56. In the thin film BAW resonator 56 shown in FIG. 3, anchor sections 22 are selectively formed in a Si substrate 21 so as to form an anchor section 22 of a prescribed pattern on the Si substrate 21. A lower electrode 24, a piezoelectric film 25 and an upper electrode 26 are successively laminated on the anchor section 22 so as to permit the laminate structure to be fixed to and supported on the anchor section 22. It should be noted that a gap 23 is provided between the upper surface of the Si substrate 21 and the lower electrode 24 in that region of the Si substrate 21 in which the anchor section 22 is not formed. In this structure, each of the lower electrode 24 and the upper electrode 26 is held in contact with the air or a vacuum layer.

The piezoelectric film 25 is held between the lower electrode 24 and the upper electrode 26. It is possible for the lower electrode 24 to be formed in contact with a part, not the entire region, of the piezoelectric film 25, as shown in FIG. 3. Likewise, it is possible for the upper electrode 26 to be formed in contact with a part, not the entire region, of the piezoelectric film 25. In the embodiment shown in FIG. 3, the piezoelectric film 25 is held between the lower electrode 24 and the upper electrode 26 in the region positioned above the gap 23, as shown in the drawing. Also, in this structure, it is possible for the piezoelectric film 25 to be in contact with the lower electrode 24 alone in a region above the anchor section 22 or to be in contact with the upper electrode 26 alone in a region above another anchor section 22.

The piezoelectric film 25 is formed of an AlN film that is oriented and grown in the c-axis direction. On the other hand, each of the lower electrode 24 and the upper electrode 26 is formed of Al. As shown in the region surrounded by a broken line in FIG. 3, a resonance section structure 27 consisting of the lower electrode 24, the upper electrode 26 and the piezoelectric film 25 held between the electrodes 24 and 26 is fixed to the Si substrate 21 by the anchor section 22, and resonance is generated at the frequency corresponding to ½ of the thickness of the piezoelectric film 25. For example, in the resonance frequency of 1 to 5 GHz, the piezoelectric film 25 is formed in a thickness of about 0.5 to 3 μm. The resonance section structure 27 is effective for bringing about particularly the resonance of a high frequency region not lower than 1 GHz. Also, an additional merit is that the thin film BAW resonator 56 is sized very small, i.e., about 100 μm square.

If an AC voltage is applied between the upper electrode 24 and the lower electrode 26, an alternating stress is generated in the piezoelectric film 25 by the piezoelectric reverse effect so as to excite the resonance of an acoustic wave of a vertical mode corresponding to the thickness direction. In order to set the resonance frequency at 2 GHz, the resonance section structure 27 is formed such that, for example, the thickness of the piezoelectric film 25 is set at 1100 nm, the thickness of the lower electrode 24 is set at 100 nm, and the thickness of the upper electrode 26 is set at 150 nm.

In the structure exemplified above, it is also possible to prepare the thin film BAW resonator 56 having a large Q value though the Q value is also dependent on the material and the preparing method of the piezoelectric film 25. In the case where the piezoelectric film 25 is formed of aluminum nitride (AlN), it is possible to achieve a very large Q value that is not smaller than several hundreds. Also, since the piezoelectric film 25, the upper electrode 26 and the lower electrode 24 can be formed by a film-deposition method such as a sputtering method, it is possible to form the resonance section structure 27 on the Si substrate 21 in an integrated and miniaturized fashion.

Also, in the structure shown in FIG. 3, the resonance phenomenon taking place in the thin film BAW resonator 56 is an acoustic resonance unlike the LC resonator in which the interaction with the ambient electromagnetic field is easily generated. As a result, acoustic energy is confined in the portion of the resonance section structure 27. It follows that, even if a plurality of FBARs 56 differing from each other in the resonance frequency are arranged close to each other, the FBARs 56 are not affected each other. Such being the situation, the particular construction is advantageous in the case where a plurality of signals differing from each other in the oscillating frequency are simultaneously oscillated by a circuit comprising a plurality of voltage controlled oscillators 1.

Figure 4:
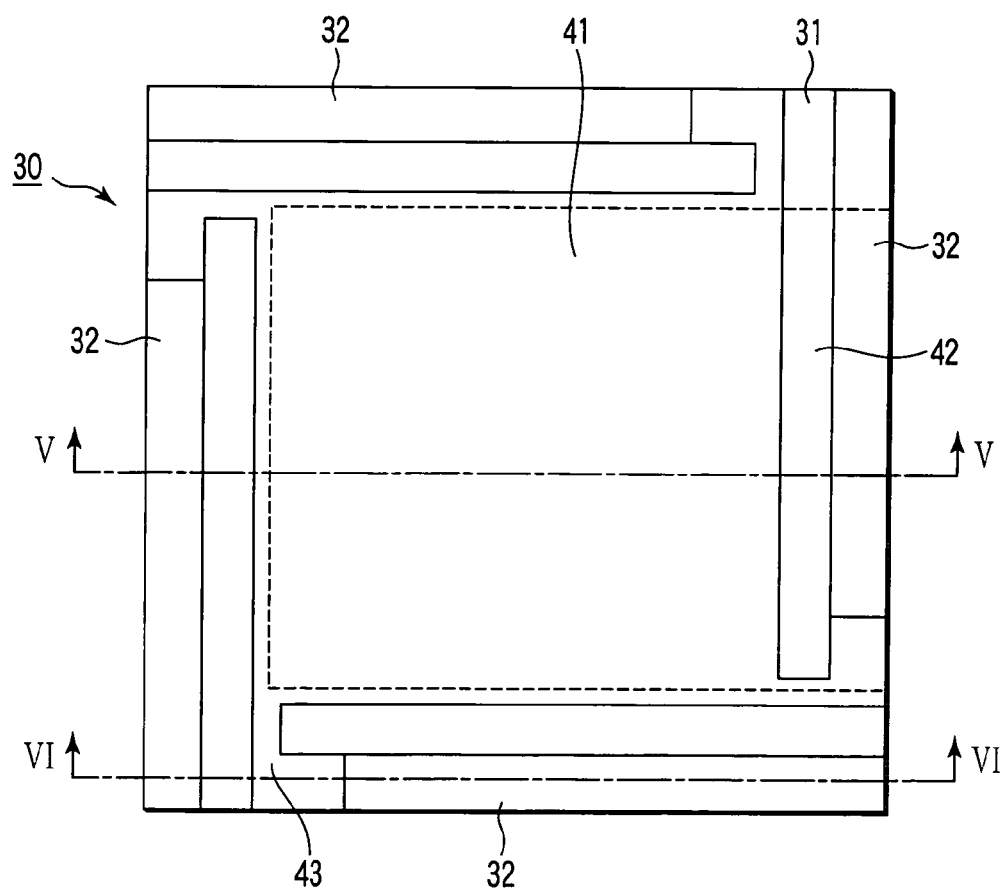
FIG. 4 is an upper view exemplifying the arrangement of the variable capacitance element formed of the thin film piezoelectric actuator included in the block diagram shown in FIG. 1.

The reactance control section 52 shown in FIG. 1 can be realized by a variable capacitance element structure 30 shown in each of FIGS. 4 to 6, the variable capacitor element structure utilizing a thin film piezoelectric actuator 32.

FIG. 4 is a plan view showing the upper side arrangement of the variable capacitor element structure 30. FIG. 5 is a cross sectional view along the line V—V shown in FIG. 4. Further, FIG. 6 is a cross sectional view along the line VI—VI shown in FIG. 4. A thin film piezoelectric actuator 32, which is generally a bimorph type thin film piezoelectric actuator, is incorporated in the variable capacitor element 30 so as to allow the variable capacitor element 30 to include a capacitance-variable capacitor structure that permits varying the distance between the mutually facing two electrodes.

The variable capacitor element 30 includes one electrode of a bimorph type thin film piezoelectric actuator 32 and one electrode of a variable capacitor 40 as a common electrode. It should be noted in this connection that it is possible for the electrode of the actuator 32 and the electrode of the variable capacitor 40 not to be formed commonly but to be formed separately. Where the electrodes noted above are formed separately, it is possible for these electrodes to be electrically connected or not be electrically connected, to each other.

In the variable capacitor element 30, four bimorph type thin film piezoelectric actuators 32 are formed in the peripheral region along four sides on the rectangular Si substrate 21, as shown in FIG. 4. Also, the variable capacitor 40 is formed on a rectangular region corresponding to the central region of the rectangular Si substrate 21 surrounded by the bimorph type thin film piezoelectric actuators 32 arranged in these four peripheral regions.

The bimorph type thin film piezoelectric actuator 32 has a laminate structure consisting of a first electrode 33 made of Al, a first piezoelectric film 34 formed on the first electrode 33, a second electrode 35 made of Al and formed on the first piezoelectric film 34, a second piezoelectric film 36 formed on the second electrode 35, and a third electrode 37 made of Al and formed on the second piezoelectric film 36. Each of the first piezoelectric film 34 and the second piezoelectric film 36 is formed of an AlN piezoelectric film having a c-axis orientation.

The bimorph type thin film piezoelectric actuator 32 has a cantilever beam structure. As apparent from FIG. 6 showing the cross section along the line VI—VI shown in FIG. 4, the stationary edge of the cantilever beam structure, i.e., the right edge of the structure shown in FIG. 6, is fixed to the Si substrate 31 via the anchor section 38. Also, the cantilever section extending from the stationary edge to the free edge, i.e., the section extending from the right edge toward the left portion, is positioned to face the surface of the Si substrate 31 such that the cantilever section floats from the Si substrate 31 with the gap 39 interposed therebetween. Also, in the cantilever beam structure, the region between the stationary edge and a region in the vicinity of the free edge is formed into the bimorph type thin film piezoelectric actuator 32, and the first electrode 33 alone extends in the tip portion, i.e., a neck section 43, between the edge of the actuator 32 and the free edge.

The first electrode 33 in the neck section 43 of the cantilever beam structure extends from the VI—VI line cross section shown in FIG. 6 to the V—V line cross section shown in FIG. 5 so as to be coupled mechanically or physically to a movable electrode 41 of the variable capacitor 40 shown in FIG. 5. In other words, the movable electrode 41 of the variable capacitor 40 is coupled to and supported on the first electrode 33 of the neck section 43 in the four corners. The first electrode 33 and the movable electrode 41 are electrically connected to each other. However, it is possible for the first electrode 33 and the movable electrode 41, which are mechanically coupled to each other, not to be electrically connected to each other. To be more specific, if the first electrode 33 and the movable electrode 41 are mechanically coupled to each other such that the movable electrode 41 is moved in accordance with the physical movement of the bimorph type thin film piezoelectric actuator 32 including the first electrode 33, it is possible to form the first electrode 33 and the movable electrode 41 as separate electrodes.

As shown in FIG. 5, the variable capacitor 40 is formed such that a stationary electrode 42 made of Al is formed on the Si substrate 31, and a dielectric film 44 made of $SiO_2$ for protecting against short-circuiting is formed on the surface of the stationary electrode 42. Also, the movable electrode 41 is suspended in a manner to face these stationary electrode 42 and dielectric film 44 with a gap 45 interposed therebetween. The movable electrode 41 is connected to the first electrode 33 via the neck section 43. In addition, the first electrode 33 is supported on the Si substrate 31 via the anchor section 38. It follows that the first electrode 33 and the dielectric film 44 are arranged a prescribed distance apart from each other in a manner to face each other.

If voltages are applied to the thin film piezoelectric actuators 32, the cantilever structure of the actuator 32 is bent. To be more specific, if voltages opposite to each other in the direction are applied between the first electrode 33 and the second electrode 35 and between the second electrode 35 and the third electrode 37, the bimorph type thin film piezoelectric actuator 32 is deformed and displaced. As an example of the driving method of the structure shown in FIGS. 4 to 7, the first electrode 33 and the third electrode 37 are connected to the ground, and a control voltage $V_{tune}$ is applied to the second electrode 35. As a result, the tip of the cantilever, i.e., the neck section 43, is displaced together with the displacement of the bimorph type thin film piezoelectric actuator 32 so as to displace the movable electrode 41. Such being the situation, the distance between the movable electrode 41 of the variable capacitor 40 and the stationary electrode 42 is changed depending on the applied voltage. Also, the capacitance of the variable capacitor 40 is changed in inverse proportion to the distance between the movable electrode 41 and the stationary electrode 42.

A maximum capacitance $C_{max}$ can be obtained when the movable electrode 41 is brought into contact with the dielectric film 44, and a minimum capacitance C0 can be obtained when the movable electrode 41 is positioned remotest from the dielectric film 44. Also, at the same time, any one of the lower electrode 24 and the upper electrode 26 of the thin film BAW resonator 56 is connected to the input terminal of the control voltage $V_{tune}$, and the other electrode is connected to the base of the transistor for the buffer. In other words, the movable electrode 41 is electrically connected to any one of the lower electrode 24 and the upper electrode 26. As a result, it is possible to operate the voltage controlled oscillator 1 using a tank circuit.

It is possible to determine the thickness of each of the first to third electrodes 33, 35, 37 of the bimorph type thin film piezoelectric actuator 32, the movable electrode 41 and the stationary electrode 42 such that the thickness falls within a range of between about 10 nm and about 1 µm in view of, for example, the resistance. In this embodiment, the thickness of any of these electrodes is set at 50 nm. Also, it is possible to determine the thickness of each of the first and second piezoelectric films 34 and 36 included in the bimorph type thin film piezoelectric actuator 32 such that the thickness falls within a range of, for example, between about 10 nm and about 1 µm in view of the amount of the displacement. In this embodiment, the thickness of each of these piezoelectric films is set at 500 nm. On the other hand, the thickness of the dielectric film 44 is set 50 nm. Also, the equivalent area of the variable capacitor is set at 6400 µm.

The capacitance of the variable capacitor 40 was measured with the control voltage $V_{tune}$, which was supplied to the bimorph type thin film piezoelectric actuator 32, set at 0 to 3V. The minimum capacitance was found to be 34 pF and the maximum capacitance was found to be 286 pF, which is 8.4 times as much as the minimum capacitance. In other words, it was possible to obtain a large variable capacitance range. In the ordinary electrostatic driving type variable capacitor, the maximum value of the capacitance variable range $C_{max}/C0$ is 1.5, i.e., $C_{max}/C0=1.5$. In the piezoelectric driving type variable capacitor according to this embodiment of the present invention, however, it was possible to expand the capacitance variable range $C_{max}/C0$ to a value larger than 3, i.e., $C_{max}/C0>3$, where $C_{max}$ denotes the maximum capacitance, and C0 denotes the minimum capacitance.

The oscillating characteristics were measured in respect of the Colpitts type voltage controlled oscillator 50. It has been found that the oscillating frequency is variable within a range of between 2.85 GHz and 3.08 GHz by the application of a control voltage of 0 to 3 V so as to obtain a large variable frequency range of 8.1%. It has also been found that the phase noise, which occurs in many mobile wireless systems, in the detune stage of 1 MHz is very small, i.e., −153 dBc/Hz. In conclusion, it has been confirmed that it is possible to obtain a voltage controlled oscillator having excellent oscillating characteristics. In the tank circuit directed to the combination of an thin film BAW resonator and an electrostatic driving type variable capacitor, the frequency change ratio Δf/f0 was found to be smaller than 1%, i.e., Δf/f0<1%. On the other hand, in the circuit directed to the combination of the thin film BAW resonator according to the embodiment of the present invention and the piezoelectric driving type variable capacitor, it was possible to realize the frequency change ratio Δf/f0, which is larger than 2%, i.e., Δf/f0>2%, so as to make it possible to expand satisfactorily the control range of the frequency.

It is possible to achieve a large displacement between the electrodes of the variable capacitor 40 by appropriately designing, for example, the thickness and the length of the bimorph type thin film type piezoelectric actuator 32 so as to make it possible to achieve a large capacitance ratio. It is also possible to achieve a small parasitic resistance (equivalent series resistance) and a large Q value by sufficiently increasing the thickness of each of the electrodes 41 and 44 of the variable capacitor 40. Incidentally, there is no difference in principle in the Q value between the ordinary electrostatic driving type variable capacitor and the piezoelectric driving type variable capacitor according to the embodiment of the present invention. As a matter of fact, no difference in the Q value noted above has been confirmed.

As described above, it is possible to manufacture an ideal voltage controlled oscillator having both a large frequency variable width and small phase noise characteristics by using a tank circuit utilizing a combination of the thin film BAW resonator 56 and a piezoelectric driving type variable capacitor element 30 using a thin film type piezoelectric actuator 32.

Incidentally, the thin film BAW resonator 56 and the variable capacitor element 30 using the thin film type piezoelectric actuator 32 are described separately in this embodiment. However, the thin film BAW resonator 56 and the variable capacitor element 30 have structures very close to each other, which are generally called a piezoelectric micro electro-mechanical system (piezoelectric MEMS), as apparent from the comparison between FIG. 3 and FIGS. 4 to 6. Such being the situation, it is possible to construct the tank circuit by forming the thin film BAW resonator 56 and the variable capacitor element 30 on the same substrate, as shown in FIGS. 7A and 7B. In this case, the manufacturing process can be made common, and the hollow sealing can also be achieved in the manufacturing process.

FIG. 7A shows the construction that the thin film BAW resonator 56 shown in FIG. 3 and the variable capacitor element 30 having a structure corresponding to the cross section along the line V—V shown in FIG. 4 are formed on the same substrate 21. On the other hand, FIG. 7B shows the construction that the thin film BAW resonator 56 shown in FIG. 3 and the variable capacitor element 30 having a structure corresponding to the cross section along the line VI—VI shown in FIG. 4 are formed on the same substrate 21. It should be noted that the tank circuit shown in FIG. 1 is formed by the constructions shown in FIGS. 7A and 7B. In FIGS. 7A and 7B, the portions equal to those shown in FIGS. 1 to 6 are denoted by the same reference numerals so as to avoid the overlapping description.

As shown in FIGS. 7A and 7B, the thin film BAW resonator 56 and the variable capacitor element 30 are formed on the Si substrate 21. For forming the structures shown in FIGS. 7A and 7B, an electrode material layer and a dielectric material layer are laminated first one upon the other on the Si substrate 21, followed by patterning the laminate structure so as to form a stationary electrode 42 in the region for forming the variable capacitor 40 and a dielectric film 44 on the stationary electrode 42. Then, an insulating film is formed further on the Si substrate 21. The insulating film is patterned later so as to form an anchor section 22 of the thin film BAW resonator 56 and an anchor section 38 of the variable capacitor element 30. Further, a first electrode material layer is formed on the insulating film. In order to make common the manufacturing process, it is desirable for the lower electrode 24 used in the thin film BAW resonator 56 and the first electrode 33 used in the thin film type piezoelectric actuator 32 to be formed of the same material. It is desirable for the first electrode 33 to be formed of a metal having a low resistivity such as aluminum (Al), gold (Au), platinum (Pt), copper (Cu), iridium (Ir), tungsten (W) or molybdenum (Mo). The first electrode material layer is patterned later so as to form the lower electrode 24 of the thin film BAW resonator 56 and the first electrode 33 of the thin film type piezoelectric actuator 32. A first piezoelectric film material layer is formed on the first electrode material layer. In order to make common the manufacturing process, it is desirable for the piezoelectric film 25 of the thin film BAW resonator 56 and the first piezoelectric film 34 of the thin film type piezoelectric actuator 32 to be formed of the same material. It is desirable for the piezoelectric film material to be provided by a ferroelectric material having a perovskite structure such as aluminum nitride (AlN), zinc oxide (ZnO), barium titanate ($BaTiO_3$), or lead zirconate titanate ($Pb(Zr, Ti)O_3$).

Similarly, a second electrode material layer is formed on the first piezoelectric film material layer. It is possible for the second electrode material to be equal to the first electrode material. The second electrode material layer is patterned later so as to form the upper electrode 26 and the second electrode 35. A second piezoelectric material layer is formed on the second electrode material layer. It is possible for the second piezoelectric material to be equal to the first piezoelectric material. The second piezoelectric material layer is patterned later in a manner to allow the first piezoelectric film material layer to be left unremoved on the side of only the variable capacitor element 30 so as to form the second piezoelectric film 36. A third electrode material layer is formed on the second piezoelectric film material layer. It is possible for the third electrode material to be equal to the first and second electrode materials. The third electrode material layer is patterned later in a manner to allow the third electrode material layer to be left unremoved on the side of only the variable capacitor element 30 so as to form the third electrode 37.

As described above, the first electrode material layer, the first piezoelectric film material layer, the second electrode material layer, the second piezoelectric film material layer, and the third electrode material layer are successively laminated one upon the other on the Si substrate 21, followed by patterning the laminate structure in a manner to selectively remove the regions other than the region for forming the bimorph type thin film piezoelectric actuator 32 or the variable capacitor 40 so as to expose the substrate 21 to the outside.

In the next step, the second piezoelectric film material layer and the third electrode material layer are selectively removed from the regions for forming the neck section 43 and the variable capacitor 40 and from the region for forming the thin film BAW resonator 56.

Then, the first piezoelectric film material layer and the second electrode material layer are selectively removed from the regions for forming the neck section 43 and the variable capacitor 40 so as to allow the first electrode 33 or the movable electrode 41 alone to be left unremoved in the regions noted above. Further, the insulating film formed below the first electrode material layer is removed partly by the wet etching from the region in which the Si substrate 21 is exposed to the outside so as to form a gap 39. Incidentally, it is also possible to remove selectively the first piezoelectric film material layer and the second electrode material layer after the wet etching process.

By the process described above, it is possible to form the tank circuit on the same substrate as shown in FIGS. 7A and 7B. Incidentally, the thin film BAW resonator 56 and the variable capacitor element 30 are separated from each other by, for example, an interlayer insulating film, though the interlayer insulating film is not shown in the construction exemplified in FIGS. 7A and 7B.

Incidentally, in the construction shown in FIGS. 7A and 7B, the thin film BAW resonator 56 and the variable capacitor element 30 are formed on the same substrate by the common process. However, the present invention is not limited to the particular case. Specifically, it is possible to form the thin film BAW resonator 56 and the variable capacitor element 30 by different processes and to form each of the electrodes and the piezoelectric films by using different materials.

As described above, according to the first embodiment of the present invention, it is possible to provide a voltage controlled oscillator having a wide frequency variable range, the voltage controlled oscillator being high in its frequency stability, excellent in its capability of suppressing the phase noise, and small in its change with time. Particularly, it is possible to provide a voltage controlled oscillator low in its influence of the disturbance from the power source voltage and in the noise radiation from the power source voltage.

In the present invention, it is unnecessary to use a series circuit or a parallel circuit of reactance elements having a markedly low Q value such as a coil in an attempt to broaden the frequency variable range. As a result, it is possible to prevent the problem that the Q value of the oscillator is further lowered by the reactance element so as to further increase the phase noise. It follows that it is possible to provide a super-miniaturized voltage controlled oscillator low in its change with time and high in stability.

Figure 8:
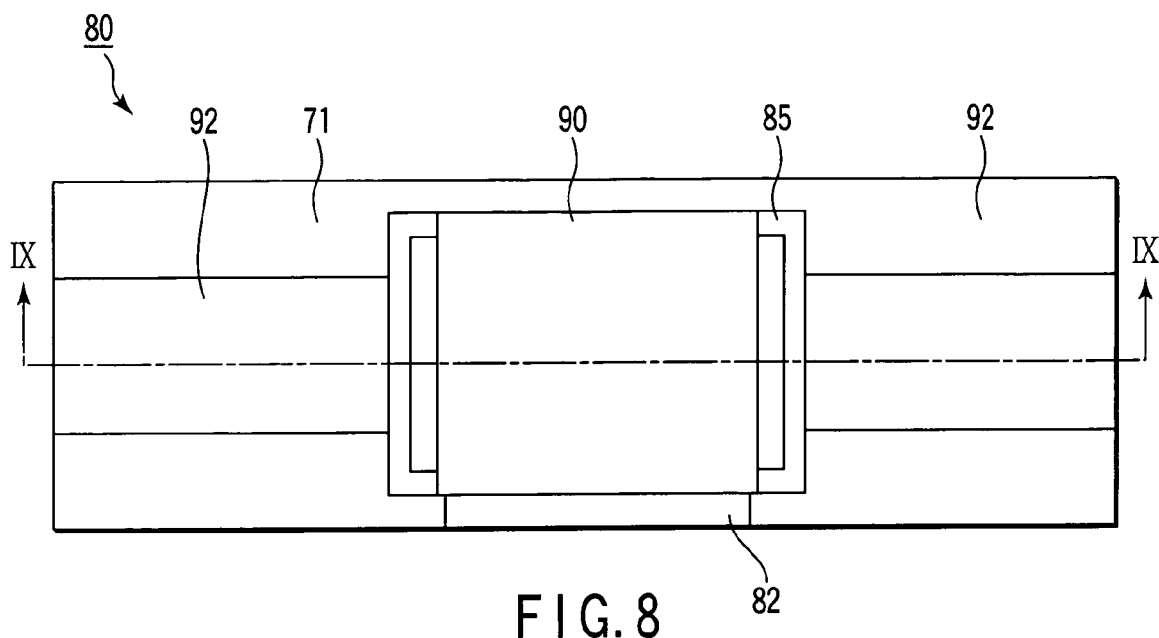
FIG. 8 is an upper view schematically showing the construction of a variable capacitance element according to another embodiment of the present invention.
Figure 9:
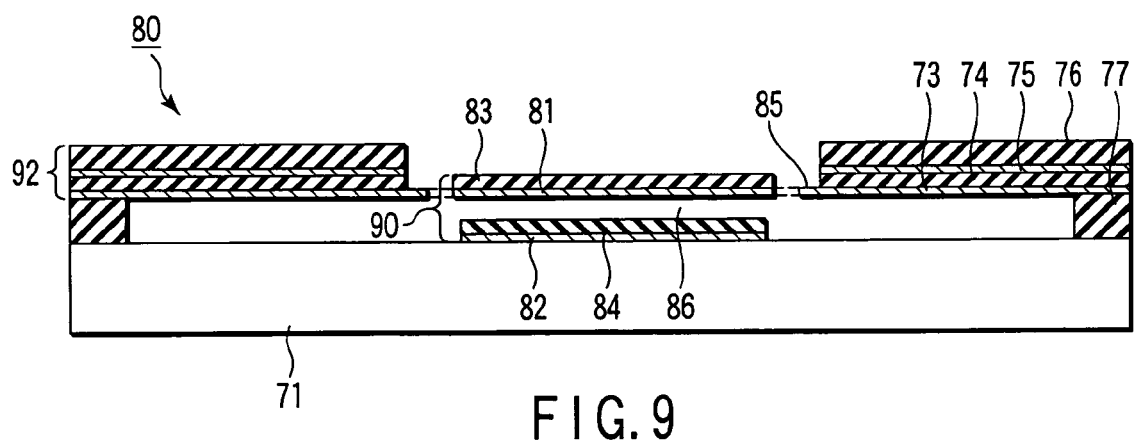
FIG. 9 is a cross sectional view along the line IX—IX shown in FIG. 8, the cross sectional view schematically showing the construction of the variable capacitance element shown in FIG. 8.

FIG. 8 is a plan view showing the planar structure of a variable capacitor element 80 according to another embodiment of the present invention, and FIG. 9 is a cross sectional view along the line IX—IX shown in FIG. 8.

The variable capacitor element 80 shown in FIG. 8 includes one electrode of an asymmetric bimorph type thin film piezoelectric actuator 92 and one electrode of a variable capacitor 90 as a common electrode. However, it is possible for one electrode of the asymmetric bimorph type thin film piezoelectric actuator 92 and one electrode of the variable capacitor 90 to be electrically connected separately to other electrodes or to be electrically independent.

As shown in FIG. 8, a pair of asymmetric bimorph type thin film piezoelectric actuators 92 are formed on a Si substrate 71 so as to be positioned on both sides of the variable capacitor 90. Each of the stationary edges of the asymmetric bimorph type thin film piezoelectric actuators 92 is fixed to the Si substrate 71 by an anchor section 77, and each of the free edges of the actuators 92 is mechanically coupled to a movable electrode 81 of the variable capacitor 90 made of Al via a neck section 85 so as to allow the movable electrode 81 to hang in the neck section 85. A reinforcing piezoelectric film 83 is formed on the movable electrode 81.

Also, a stationary electrode 82 made of Al and a dielectric film 84 made of $SiO_2$ and formed on the surface of the stationary electrode 82 for preventing short-circuiting are successively formed on the Si substrate 71. Each of these stationary electrode 82 and the dielectric film 84 is formed to face the movable electrode 81 with a gap 86 provided therebetween.

The asymmetric bimorph type thin film piezoelectric actuator 92 includes a first electrode 73 made of Al, a c-axis oriented piezoelectric film 74 made of ZnO and formed on the first electrode 73, and a second electrode 75 formed on the piezoelectric film 74. Further, a support film 76 for forming an asymmetric bimorph, which is made of $SiO_2$, is formed on the second electrode 75.

In the present invention, it is possible for the first electrode 73 and the movable electrode 81 to be electrically connected to each other or not to be electrically connected to each other. If the first electrode 73 is mechanically coupled to the movable electrode 81 such that the movable electrode 81 is moved in accordance with the physical movement of the asymmetric bimorph type thin film piezoelectric actuator 92 including the first electrode 73, it is possible to form the first electrode 73 and the movable electrode 81 as separate electrodes.

If the control voltage $V_{tune}$ is applied between the first electrode 73 and the second electrode 75, the bimorph operation is generated so as to displace the asymmetric bimorph type thin film piezoelectric actuator 92. It should be noted that a maximum capacitance $C_{max}$ is obtained when the movable electrode 81 is brought into contact with the dielectric film 84, and a minimum capacitance C0 is obtained when the movable electrode 81 is positioned remotest from the dielectric film 84.

It is possible to select from within the range of, for example, between 10 nm and 1 μm the thickness of each of the first electrode 73 and the second electrode 75 of the asymmetric bimorph type thin film piezoelectric actuator 92, as well as the thickness of each of the movable electrode 81 and the stationary electrode 82 of the variable capacitor 90 in view of, for example, the resistance. In this embodiment, the thickness is set at 50 nm for all the electrodes noted above. Also, the thickness of the piezoelectric film 74 included in the asymmetric bimorph type thin film piezoelectric actuator 92 can be selected from within the range of, for example, between 10 nm and 1 μm. In this embodiment, the thickness of the piezoelectric film 74 is set at 400 nm. Also, the thickness of the dielectric film 84 is set at 30 nm. Further, the equivalent area of the variable capacitor 90 is set at 6400 μm.

The capacitance of the variable capacitor 90 was measured by applying a control voltage $V_{tune}$ of 0 to 3V to the asymmetric bimorph type thin film piezoelectric actuator 92. The minimum capacitance was found to be 56 pF, and the maximum capacitance was found to be 356 pF, which is 8.2 times as much as the minimum capacitance. Incidentally, the operation of the thin film BAW resonator 56 is equal to the operation of the thin film BAW resonator 56 for the first embodiment described previously.

The oscillating characteristics were measured by using the balanced voltage controlled oscillator 50. It has been found that a large variable frequency range of 10.5%, i.e., the oscillating frequency falling within a range of between 2.57 GHz and 2.84 GHz, can be obtained by the application of a control voltage of 0 to 3V. Also, the phase noise has been found to be very small, i.e., −149 dBc/Hz, in the detune stage of 1 MHz. Such being the situation, it has been confirmed that it is possible to obtain a voltage controlled oscillator having excellent oscillating characteristics.

Incidentally, it is apparent that the variable capacitor element 80 and the thin film BAW resonator 56 can be formed on the same substrate so as to form a tank circuit.

Figure 10:
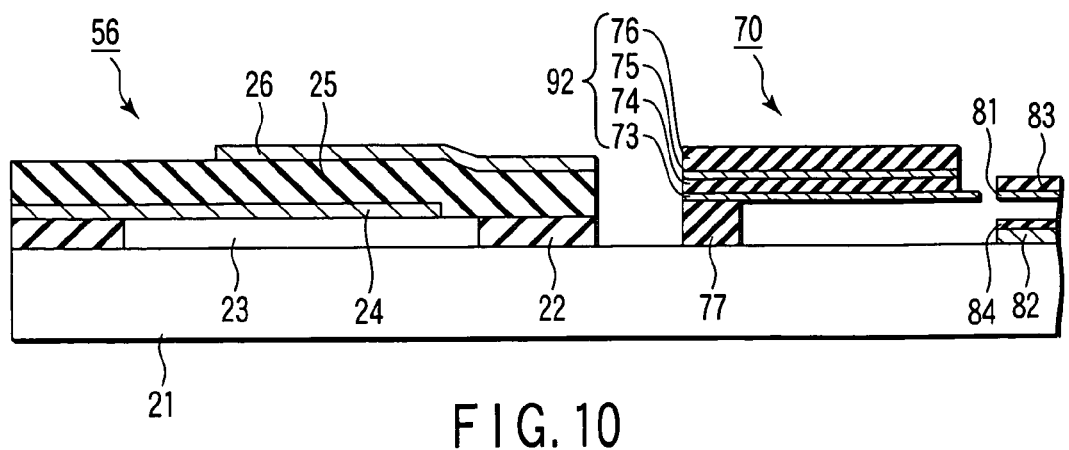
FIG. 10 is a cross sectional view schematically showing the construction of a tank circuit according to another embodiment of the present invention, the tank circuit including a thin film BAW resonator and a variable capacitance element formed on the same substrate.

FIG. 10 is a cross sectional view showing the construction of a tank circuit according to another embodiment of the present invention, the tank circuit being formed of the thin film BAW resonator 56 and the variable capacitor element 80 formed on the same substrate. In FIG. 10, the portions equal to the portions shown in the drawings referred to previously are denoted by the same reference numerals so as to avoid the overlapping description. The method of manufacturing the structure shown in FIG. 10 is equal to the method of manufacturing the structure shown in FIG. 7 directed to the first embodiment of the present invention, except that the structure shown in FIG. 10 differs from the structure shown in FIG. 7 in the shape of the patterning. Such being the situation, the detailed description of the method of manufacturing the structure shown in FIG. 10 is omitted. Incidentally, the thin film BAW resonator 56 and the variable capacitor element 80 are separated from each other by, for example, an interlayer insulating film, though the interlayer insulating film is not particularly shown in FIG. 10.

In preparing the structure shown in FIG. 10, the thin film BAW resonator 56 and the variable capacitor 80 are formed simultaneously on the same Si substrate 21, and the anchor section 22 of the thin film BAW resonator 56 and the anchor section 77 of the variable capacitor element 80 are formed simultaneously. Also, the lower electrode 24 of the thin film BAW resonator 56, the movable electrode 81 of the variable capacitor element 80, and the first electrode 73 are formed simultaneously. Further, the piezoelectric film 25 of the thin film BAW resonator 56, the piezoelectric film 74 of the variable capacitor element 80, and a movable electrode reinforcing film 83 are formed simultaneously. The particular construction described above makes it possible to simplify the manufacturing process.

Incidentally, the thin film BAW resonator 56 and the variable capacitor element 80 shown in FIG. 10 are formed simultaneously. However, it is also possible to form simultaneously the thin film BAW resonator 60b together with the thin film BAW resonator 56 and the variable capacitor element 80.

Figure 11:
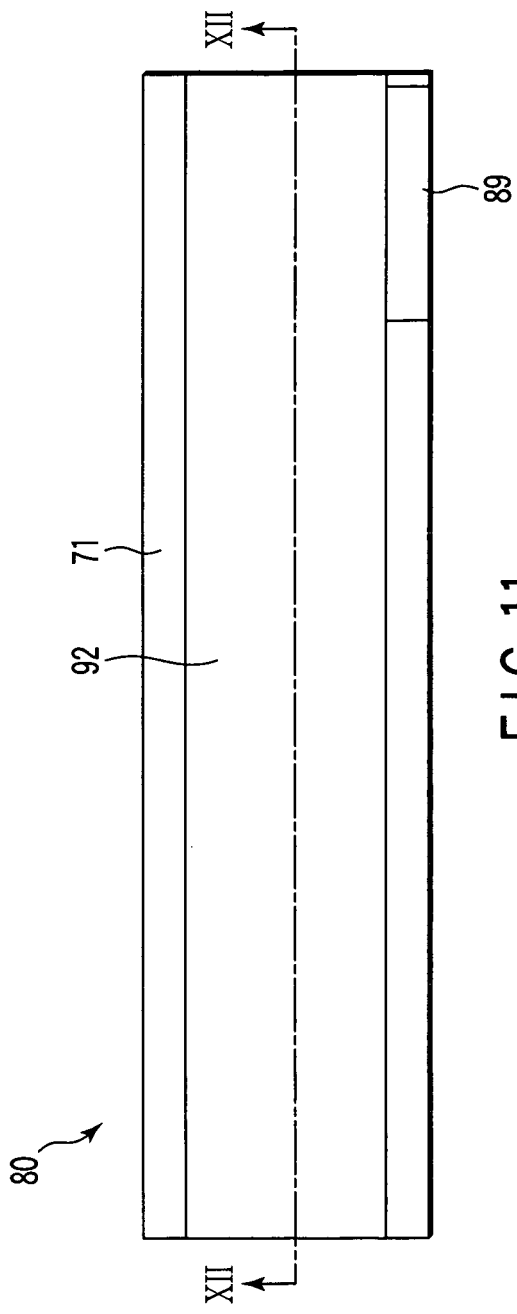
FIG. 11 is a cross sectional view schematically showing the construction of a variable capacitance element according to still another embodiment of the present invention.
Figure 12:
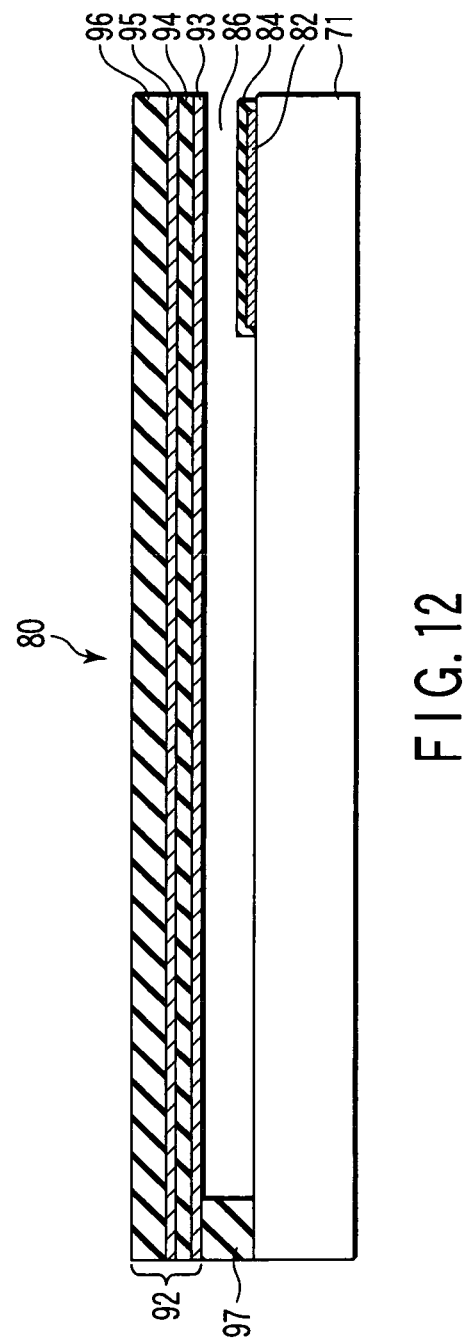
FIG. 12 is a cross sectional view along the line XII—XII shown in FIG. 11, the cross sectional view schematically showing the construction of the variable capacitance element shown in FIG. 11.

FIG. 11 is a plan view showing the planar structure of a variable capacitor element 80 according to still another embodiment of the present invention, and FIG. 12 is a cross sectional view along the line XII—XII shown in FIG. 11.

In the variable capacitor element 80 shown in FIGS. 11 and 12, the asymmetric bimorph type thin film piezoelectric actuator 92 is formed in a cantilever structure. To be more specific, the stationary edge of the piezoelectric actuator 92 is fixed to an anchor section 97 that is fixed to a substrate 71, and the other edge of the piezoelectric actuator 92 forms a free edge. Also, a stationary electrode 82 is formed in that region of the substrate 71 which is positioned to face the distal edge portion including the free edge of the piezoelectric actuator 92. The stationary electrode 82 is covered with a dielectric film 84 made of $SiO_2$ for preventing the short-circuiting. The stationary electrode 82 and the dielectric film 84 are positioned to face a lower electrode 93 corresponding to the movable electrode with a hollow portion, i.e., a gap 86, interposed therebetween.

The asymmetric bimorph type thin film piezoelectric actuator 92 has a laminate structure including the lower electrode 93 made of Al, a c-axis oriented piezoelectric film 94 formed on the lower electrode 93, and an upper electrode 95 formed on the piezoelectric film 94, which are laminated one upon the other in the order mentioned. Further, a support film 96 made of $SiO_2$ and serving to form an asymmetric bimorph is formed on the upper electrode 95.

If a control voltage $V_{tune}$ is applied between the lower electrode 93 and the upper electrode 95, a bimorph operation is generated so as to displace the free edge of the asymmetric bimorph thin film piezoelectric actuator 92. It should be noted that a maximum capacitance $C_{max}$ can be obtained when the lower electrode 93 is brought into contact with the dielectric film 84, and a minimum capacitance C0 is obtained when the lower electrode 93 is positioned remotest from the dielectric film 84.

It is possible to realize the variable capacitor element 80 even in the cantilever structure as shown in FIGS. 11 and 12 so as to set the capacitance variable range $C_{max}/C0$ at a sufficiently large value.

As described above, according to this embodiment of the present invention, it is possible to provide a super-miniaturized voltage controlled oscillator, which is high in its frequency stability, which is excellent in its capability of suppressing the phase noise, and which has a wide frequency variable range that is small in change with time. Particularly, the present invention according to this embodiment makes it possible to provide a voltage controlled oscillator that is small in the influence of the disturbance from the power source voltage and in the noise radiation to the power source voltage. Also, it is unnecessary to use a reactance element in an attempt to broaden the frequency variable range. As a result, it is possible to avoid the problem that the Q value is further lowered by the reactance element so as to further increase the phase noise. It follows that it is possible to provide a voltage controlled oscillator that is small in change with time and high in its stability.

As described above, the present invention provides a voltage controlled oscillator, which is excellent in its capability of suppressing the phase noise and which has a broad frequency variable range.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A voltage controlled oscillator, comprising a thin film BAW resonator and a variable capacitor element, the thin film BAW resonator including:
a first substrate section;
a first support section formed on the first substrate section;
a lower electrode supported on the first support section and arranged to face the first substrate section;
a first piezoelectric film formed on the lower electrode; and
an upper electrode formed on the first piezoelectric film; and the variable capacitor element including:
a second substrate section;
a stationary electrode formed on the second substrate section;
a second support section formed on the second substrate section;
an actuator including a first electrode supported on the second support section, a second piezoelectric film formed on the first electrode, and a second electrode formed on the second piezoelectric film; and p1 a movable electrode arranged to face the stationary electrode, mechanically coupled to and supported on the actuator and electrically connected to one of the lower electrode and the upper electrode.

2. The voltage controlled oscillator according to claim 1, wherein the first substrate section and the second substrate section are formed on a single substrate.

3. The voltage controlled oscillator according to claim 1, wherein the first and second piezoelectric films are formed of the same material.

4. The voltage controlled oscillator according to claim 1, wherein each of the first and second piezoelectric films is formed of one material selected from the group consisting of aluminum nitride (AlN), zinc oxide (ZnO), and a ferroelectric material having a perovskite structure.

5. The voltage controlled oscillator according to claim 1, wherein the lower electrode, the movable electrode and the first electrode are formed of the same material.

6. The voltage controlled oscillator according to claim 1, wherein the upper electrode and the second electrode are formed of the same material.

7. The voltage controlled oscillator according to claim 1, wherein at least one of the lower electrode, the movable electrode, the upper electrode, the first electrode, and the second electrode is formed of a material selected from the group consisting of aluminum (Al), gold (Au), platinum (Pt), copper (Cu), iridium (Ir), tungsten (W), and molybdenum (Mo).

8. The voltage controlled oscillator according to claim 1, wherein the variable capacitor element further comprises:
a third piezoelectric film formed on the second electrode; and
a third electrode formed on the third piezoelectric film.

9. The voltage controlled oscillator according to claim 2, wherein the first and second support sections are formed in the same process step.

10. The voltage controlled oscillator according to claim 2, wherein the lower electrode, the movable electrode, and the first electrode are formed in the same manufacturing process.

11. The voltage controlled oscillator according to claim 2, wherein the first and second piezoelectric films are formed in the same manufacturing process.

12. The voltage controlled oscillator according to claim 2, wherein the upper electrode and the second electrode are formed in the same manufacturing process.

13. The voltage controlled oscillator according to claim 1, wherein the variable capacitor has a capacitance variable range $C_{max}/C0$, which is larger than 3 ($C/C0 >3$).

14. The voltage controlled oscillator according to claim 1, wherein the voltage controlled oscillator has a frequency change ratio $\Delta f/f0$, which is larger than 2% ($\Delta f/f0 > 2\%$).

* * * * *